United States Patent [19]

Lee et al.

[11] Patent Number: 4,945,264
[45] Date of Patent: Jul. 31, 1990

[54] INTERFACE CONTROL CIRCUIT WITH ACTIVE CIRCUIT CHARGE OR DISCHARGE

[75] Inventors: Kun-Ming Lee, Taipei; Ching-Dong Hwang, Keelung, both of Taiwan

[73] Assignee: Acer Incorporated, Taipei, Taiwan

[21] Appl. No.: 314,333

[22] Filed: Feb. 22, 1989

[51] Int. Cl.⁵ .................... H03K 19/092; H03K 19/00
[52] U.S. Cl. ................................ 307/475; 307/443; 307/473
[58] Field of Search ................ 307/473, 475, 443

[56] References Cited

U.S. PATENT DOCUMENTS

| | | | |
|---|---|---|---|
| 4,518,873 | 5/1985 | Suzuki et al. | 307/475 |
| 4,529,895 | 7/1985 | Garverick et al. | 307/443 |
| 4,691,127 | 9/1987 | Huizer | 307/443 |
| 4,760,279 | 7/1988 | Saito et al. | 307/520 |
| 4,761,572 | 8/1988 | Tanizawa | 307/443 |
| 4,843,262 | 6/1989 | Abe | 307/475 |

Primary Examiner—Stanley D. Miller
Assistant Examiner—Richard Roseen
Attorney, Agent, or Firm—Townsend and Townsend

[57] ABSTRACT

An interface control circuit comprising a buffer, an inverter, an OR gate and delay means. The interface control circuit can be utilized in digital systems for communication handshaking such that a buffer output current will actively flow through line stray capacitance thereby greatly reducing the rise time from a LOW state to a HIGH state, or charges in the line stray capacitance will actively discharge through the buffer means if negative logic mode is used thereby enabling a great reduction in fall time, therefore a much faster and efficient digital system can be obtained through the use of the invention.

6 Claims, 3 Drawing Sheets

INTERFACE CONTROL CIRCUIT WITH ACTIVE CIRCUIT CHARGE OR DISCHARGE

BACKGROUND OF THE INVENTION

1. Field of the Invention

The present invention relates to an interface control circuit which is utilized in the interface between logic systems for communication handshaking.

2. Brief Description of the Relevant Art

FIG. 1 illustrates an interface control circuit of the prior art. The input of buffer A is grounded. Therefore, if a "1" is applied to the "ENABLE" line of the buffer, a "0" appears at the output thereof. A problem arises, however, when the output of the buffer is to be raised to a HIGH from a LOW. If the ENABLE line of the buffer changes from "1" to "0", the voltage level of the buffer output cannot shift to HIGH instantly. Instead, Vcc potential source begins to charge line capacitance Cs through a pull-up resistor R1. As shown in FIG. 2, the rise time from t1 when the output is 10% of Vcc voltage to t2 when the output is 90% of Vcc voltage takes about 3R1Cs. In the usual situation, R1 is likely to be about 3.3K ohms and Cs approximately 50 pf, which makes the rise time $3*3.3*10^3*500*10^{-12}$, or about 500 nanoseconds. Thus, when the circuit is used in communication interfaces, the logic circuit on one side has to wait a rather lengthy time, while the other side has already finished a task and signals the status by changing the control line from LOW to HIGH. It therefore lowers the overall speed and efficiency of a digital system.

SUMMARY OF THE INVENTION

A primary object of the present invention is to provide a novel interface control circuit which is so configured that a source current or a sink current will actively flow from or into the buffer in the circuit upon the output of buffer changing from a LOW state to a HIGH state or from a HIGH state to a LOW state, depending on positive logic or negative logic is adopted, whereby much less rise time or fall time is achieved. Therefore, with the present invention "handshaking" within logic systems is much more effective and efficient.

In a preferred embodiment the interface control circuit of this invention includes a buffer, an inverter, an OR gate and a delay circuit. The buffer has an input terminal, an output terminal, and an enable line. The inverter has an output terminal connected to the input of the buffer, while the OR gate has one input connected to the input terminal of the inverter and has an output terminal connected to the enable line. The delay circuit has an input connected to the input terminal of the inverter and an output terminal connected to the other input terminal of the OR gate.

Other merits and benefits of the present invention will be readily understood as the following description in detail proceeds with reference to the accompanying drawings.

DETAILED DESCRIPTION OF THE DRAWINGS

DETAILED DESCRIPTION OF THE PREFERRED EMBODIMENT

Figure 2:
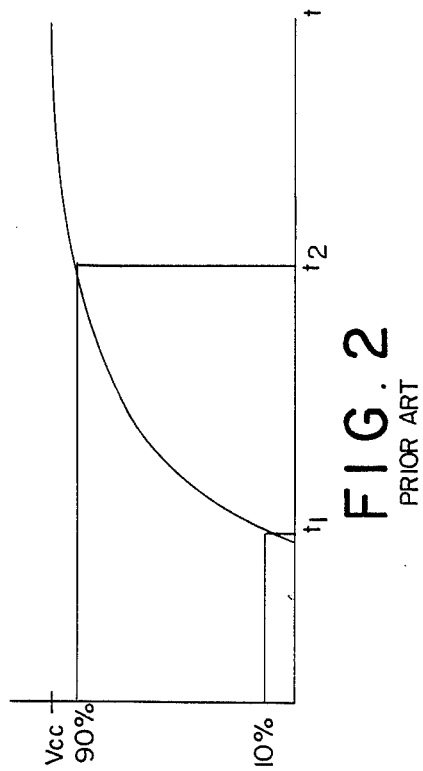
FIG. 2 is a waveform illustrating the rise time when the output of the interfacing control circuit transfers from LOW to HIGH in the prior art.
Figure 1:
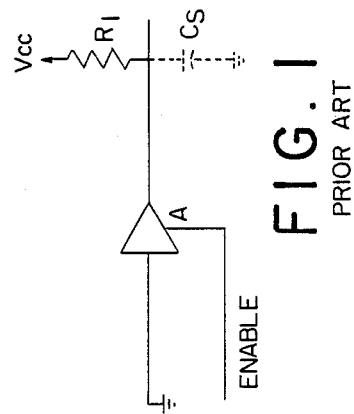
FIG. 1 shows an interfacing control circuit used in the prior art.
Figure 3:
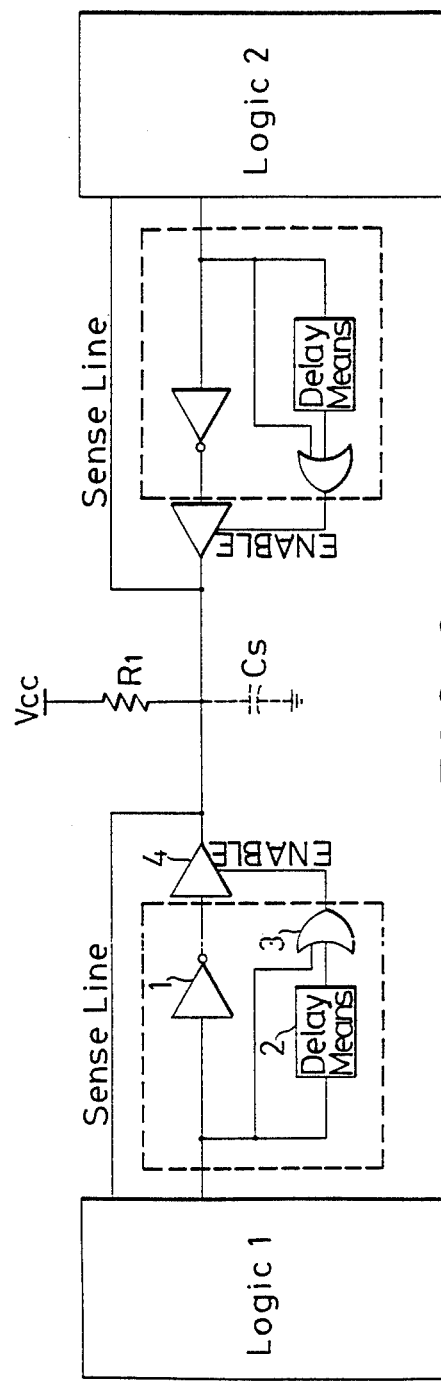
FIG. 3 shows a digital system comprising the interfacing control circuits in accordance with the present invention.

Referring to FIG. 3, there are shown two interfacing control circuits between two logic circuits, designated as LOGIC 1 and LOGIC 2 according to the invention. The present invention differs from the prior art in that between the logic circuits there are disposed an inverter 1, delay means 2 and an OR gate 3, encompassed in dashed lines. The input terminal of inverter 1 is connected to logic circuit as well as to the input of delay means 2 and one of the input terminals of OR gate 3. The output of inverter 1 is connected to the input of the buffer 4 while the output of the OR gate 3 is attached to the ENABLE line of the buffer 4.

The output of buffer 4 is connected to a Vcc source through a pull-up resistor R1. Note that the output of the buffer 4 is also coupled to a logic circuit through a sense line for the utilization of the logic circuit to sense the status of the output of buffer 4. LOGIC 2 can also employ the same interfacing control circuit as LOGIC 1 as illustrated in the diagram; alternatively, conventional interfacing circuit can be employed in the LOGIC 2 side if the rise time is not a major concern for LOGIC 2.

Figure 4:
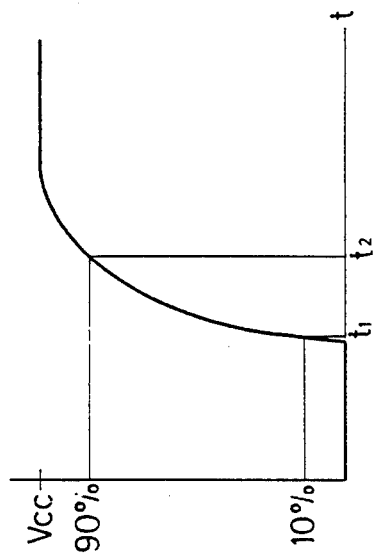
FIG. 4 is a waveform illustrating the rise time when the output of the interfacing control circuit transfers from LOW to HIGH in accordance with the present invention.

In the event that LOGIC 1 sends out a "1", the inverter 1 inverts it into a "0" and the output of the OR gate 3 is a "1" which enables the buffer 4, therefore the output of the buffer is a "0" and LOGIC 2 can sense the status of LOGIC 1 by way of a sense line. Now if LOGIC 1 changes its output to a "0" signaling a change of its status, the inverter 1 reverses its input into a "1" and one input to the OR gate is a "0". Since the delay means 2, whose delay time may be 10 nanoseconds, has delayed the preceding input, a "1", to the delay means, a "1" still appears on the output of the delay means 2 for some time. This output node is connected to the other input of the OR gate 3. Therefore, the ENABLE line of the buffer 4 is still enabled and a "1" thus appears on the output of the buffer which will actively charge the stray line capacitance. Accordingly, this greatly reduces the rise time from a LOW status to a HIGH status as can be seen in FIG. 4, thereby permitting LOGIC 2 to be aware of the change of status in LOGIC 1 much sooner, so that all following actions can be taken in a higher speed. Thus, a much more effective and efficient way of handshaking is achieved between logic circuits, and the overall speed and performance of the digital system is enhanced.

The rise time using this invention can be calculated as follows:

Q=CV
It=CV
t=CV/I where Q is the accumulated charge in the stray line capacitance Cs, C is the quantity of the stray line capacitance Cs in farads, V is the voltage across Cs, I is the current flowing through Cs in amperes, and t is the rise time for Cs changing from a LOW state to a HIGH state. With TTL logic gates, HIGH state is defined as within 2.8 V–5.0 V and LOW state within 0 V–0.8 V, and the output driving current of the buffer 4 is generally about 15 mA. Therefore, taking V as 3 volts and Cs as 50 pf, the rise time approximately equals:

$$t = CV/I = 50*10^{-12}*3/15*10^{-3} = 10 \text{ nanoseconds}$$

as shown in FIG. 4, which is much faster (about 50 times) than the prior art.

The requisite delay time of the delay means 2 depends on the output driving capacity of the buffer 4. The larger the driving capacity of the buffer, the less delay time is required, and vice versa.

Figure 5:
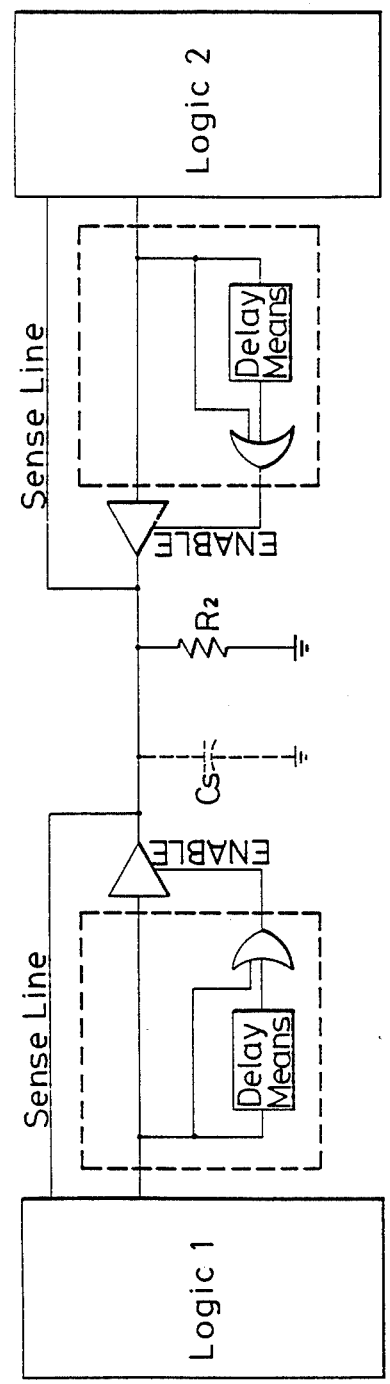
FIG. 5 shows a digital system comprising another preferred embodiment of an interfacing control circuit employing negative logic in accordance with the present invention.

Alternatively, the present invention can be utilized in negative logic mode as shown in FIG. 5, in which the inverter is not present and a pull-down resistor R2 is connected from the output of the buffer to the ground. When the output of the buffer shifts from a "1" to a "0", the charges stored in the line stray capacitance Cs will discharge quickly through the buffer, thereby enabling a much faster shifting from HIGH state to LOW state, thus a much shorter fall time is obtained. The whole process is analogous to that in positive logic as can be readily understood by those skilled in the art.

Although the present invention has fully been described in connection with the preferred embodiments thereof with reference to the accompanying drawings, it is to be noted that various changes and modifications are apparent to those skillful in the art. Such changes and modifications are to be understood as included within the scope and spirit of the present invention.

We claim:

1. An interface control circuit for handshaking between logic circuits comprising:
   buffer means having at least an input terminal, an output terminal coupled to a potential source through a resistive element, and an ENABLE line;
   an inverter having an input terminal and having an output terminal connected to the input terminal of the buffer means;
   an OR gate having one input terminal connected to the input terminal of the inverter and an output terminal connected to the ENABLE line of the buffer means; and
   delay means having an input terminal connected to the input terminal of the inverter and an output terminal coupled to another input terminal of the OR gate.

2. The interface control circuit of claim 1, further comprising a logic circuit associated with the interface control circuit wherein an output of the logic circuit is connected to the input terminal of the inverter and a sense line extends from the logic circuit to the output terminal of the buffer means.

3. An interface control circuit for handshaking between logic circuits in negative logic mode comprising:
   buffer means having at least an input terminal, an output terminal grounded through a resistive element and an ENABLE line;
   an OR gate having two input terminals, one of which is connected to the input terminal of the buffer means and having an output connected to the ENABLE line of the buffer means;
   delay means having an input terminal connected to the input terminal of the buffer means and an output terminal coupled to another input terminal of the OR gate.

4. The interface control circuit of claim 3, further comprising a logic circuit associated with the interface control circuit, wherein an output of the logic circuit is connected to the input terminal of the delay means and a sense line extends from said logic circuit to the output terminal of the buffer means.

5. The interface control circuit of claim 1 wherein a delay time of the delay means is inversely proportional to an output driving capacity of the buffer means.

6. The interface control circuit of claim 3 wherein a delay time of the delay means is inversely proportional to an output driving capacity of the buffer means.

* * * * *